(12) United States Patent
Cesar

(10) Patent No.: US 10,530,563 B2
(45) Date of Patent: Jan. 7, 2020

(54) CLOCK SYNCHRONIZATION DEVICE

(71) Applicant: STMicroelectronics (Grenoble 2) SAS, Grenoble (FR)

(72) Inventor: Etienne Cesar, Voreppe (FR)

(73) Assignee: STMICROELECTRONICS (GRENOBLE2) SAS, Grenoble (FR)

( * ) Notice: Subject to any disclaimer, the term of this patent is extended or adjusted under 35 U.S.C. 154(b) by 0 days.

(21) Appl. No.: 15/898,816

(22) Filed: Feb. 19, 2018

(65) Prior Publication Data

US 2018/0375637 A1 Dec. 27, 2018

(30) Foreign Application Priority Data

Jun. 23, 2017 (FR) ...................................... 17 55783

(51) Int. Cl.
*H04L 7/033* (2006.01)
*H03L 7/085* (2006.01)
*H03L 7/099* (2006.01)

(52) U.S. Cl.
CPC .............. *H04L 7/033* (2013.01); *H03L 7/085* (2013.01); *H03L 7/099* (2013.01)

(58) Field of Classification Search
CPC .......... H03L 7/089; H03L 7/091; H03L 7/085
See application file for complete search history.

(56) References Cited

U.S. PATENT DOCUMENTS

| 4,513,427 | A | | 4/1985 | Borriello et al. | |
|---|---|---|---|---|---|
| 5,652,531 | A | * | 7/1997 | Co ........................... | H03L 7/089 327/12 |
| 6,259,755 | B1 | | 7/2001 | O'Sullivan et al. | |
| 6,392,457 | B1 | | 5/2002 | Ransijn | |
| 6,549,598 | B1 | | 4/2003 | Kumaki | |
| 6,614,314 | B2 | * | 9/2003 | d'Haene .............. | H03D 13/003 327/12 |
| 2002/0154722 | A1 | * | 10/2002 | Djahanshahi ........ | H03D 13/004 375/375 |
| 2004/0061539 | A1 | * | 4/2004 | Joordens .............. | H03D 13/004 327/165 |
| 2004/0232947 | A1 | * | 11/2004 | Temporiti Milani ........ | H03D 13/004 327/2 |
| 2006/0008075 | A1 | * | 1/2006 | Scott ..................... | H04M 1/738 379/399.01 |

(Continued)

FOREIGN PATENT DOCUMENTS

| JP | H11186902 A | 7/1999 |
|---|---|---|
| JP | 2009077134 A | 4/2009 |

OTHER PUBLICATIONS

"Phase-locked loop", Wikipedia, May 4, 2017, 15 pages.

*Primary Examiner* — Aristocratis Fotakis
(74) *Attorney, Agent, or Firm* — Slater Matsil, LLP

(57) ABSTRACT

In an embodiment, a clock synchronizing circuit includes: a phase comparator including a first circuit having a first input configured to receive a data signal; and a second circuit. The first circuit is configured to detect edges of the data signal. The second circuit includes a clock generator configured to generate a clock signal with adjustable frequency, where the phase comparator is configured to compare, after detecting an edge of the data signal, an edge of the data signal with an edge of the clock signal, and where the second circuit is configured to modify a frequency of the clock signal as a function of an output signal of the phase comparator.

22 Claims, 3 Drawing Sheets

(56) References Cited

U.S. PATENT DOCUMENTS

| | | | | |
|---|---|---|---|---|
| 2006/0109940 A1* | 5/2006 | Beukema | ............... | H04L 7/0058 |
| | | | | 375/350 |
| 2007/0286321 A1* | 12/2007 | Gupta | ..................... | H03L 7/091 |
| | | | | 375/375 |
| 2009/0121746 A1* | 5/2009 | Lin | ....................... | H03L 7/0891 |
| | | | | 327/7 |
| 2009/0160487 A1* | 6/2009 | Hu | ......................... | H03D 13/00 |
| | | | | 327/3 |
| 2010/0019799 A1* | 1/2010 | El-Kik | ................. | G01R 25/005 |
| | | | | 327/2 |
| 2010/0264963 A1* | 10/2010 | Kikuchi | ................. | H03K 5/131 |
| | | | | 327/157 |
| 2012/0313715 A1* | 12/2012 | Kargar | ................... | G01R 23/02 |
| | | | | 331/34 |

* cited by examiner

CLOCK SYNCHRONIZATION DEVICE

CROSS-REFERENCE TO RELATED APPLICATIONS

This application claims priority to French Patent Application No. 1755783, filed on Jun. 23, 2017, which application is hereby incorporated herein by reference.

TECHNICAL FIELD

The present application relates generally to electronic circuits, and in particular embodiments, to a clock synchronizing device.

BACKGROUND

Binary data can be transmitted by a sending system to a receiving system via synchronous or asynchronous transmission. When the transmission is synchronous, the data signal and the corresponding clock signal are transmitted to the receiving system. When only the data signal is transmitted, the transmission is said to be asynchronous.

In the case of asynchronous transmission, it is necessary to restore (i.e., recover) the clock signal corresponding to the data signal such as to be able to recover the exact data sent by the sending system.

However, it is difficult to provide a device for synchronizing a clock signal making it possible to obtain the frequency corresponding to the data signal quickly and while consuming little energy.

SUMMARY

Some embodiments relate to the transmission of binary data and, more particularly, to the synchronization of a clock signal with a data signal by the receiving system. In some embodiments, a transmitter generates a data signal, a receiver receives the data signal that was transmitted asynchronously by the transmitter, and the receiver recovers the clock associated with the data signal by using a clock synchronization circuit.

An embodiment provides a clock synchronizing circuit including: a first circuit suitable for detecting the rising and/or falling edges of a data signal; a generator of a clock signal with adjustable frequency; a phase comparator suitable for comparing, after detecting an edge of the data signal, an edge of the data signal with an edge of the clock signal; and a second circuit suitable for modifying the frequency of the clock signal as a function of the output signal from the phase comparator.

According to an embodiment, the first circuit is a first flip-flop having a data input of connected to a high-voltage rail, and a clock input connected to a data signal line.

According to an embodiment, the phase comparator includes second and third flip-flops, the data input of each of the second and third flip-flops being connected to the output of the first circuit, the clock input of the second flip-flop being connected to the output of a circuit delaying the clock signal with adjustable frequency, the clock input of the third flip-flop being connected to the output of a circuit likewise delaying the data signal, the outputs of the second and third flip-flops being connected to the second circuit.

According to an embodiment, the phase comparator includes an AND gate having inputs connected to the outputs of the second and third flip-flops. The AND gate also having an output connected to inputs for resetting the second and third flip-flops and the first circuit.

According to an embodiment, the delayed signals are delayed by a duration between 2% and 50% of the data rate.

According to an embodiment, the first circuit is suitable for detecting the rising edges of the data signal. In other embodiments, the first circuit is suitable for detecting the falling edges of the data signal.

One embodiment provides an electronic device including: a circuit for transmitting data; and a circuit for receiving data including the clock synchronizing circuit.

BRIEF DESCRIPTION OF THE DRAWINGS

These features and advantages, as well as others, will be disclosed in detail in the following description of specific embodiments given in a non-limiting manner with reference to the appended figures wherein.

DETAILED DESCRIPTION OF ILLUSTRATIVE EMBODIMENTS

Identical elements have been designated by identical references in the various figures and, moreover, the various figures are not drawn to scale. For the purpose of clarity, only the elements that are useful for understanding the described embodiments have been shown and are detailed. In particular, the operation of the elements of a phase-locked loop other than the phase comparator is not described in detail.

Unless otherwise specified, the expression "approximately" signifies to within 10%, preferably to within 5%.

The signal values 0 and 1 correspond to a low level of voltage and to a high level of voltage, respectively.

Figure 1:
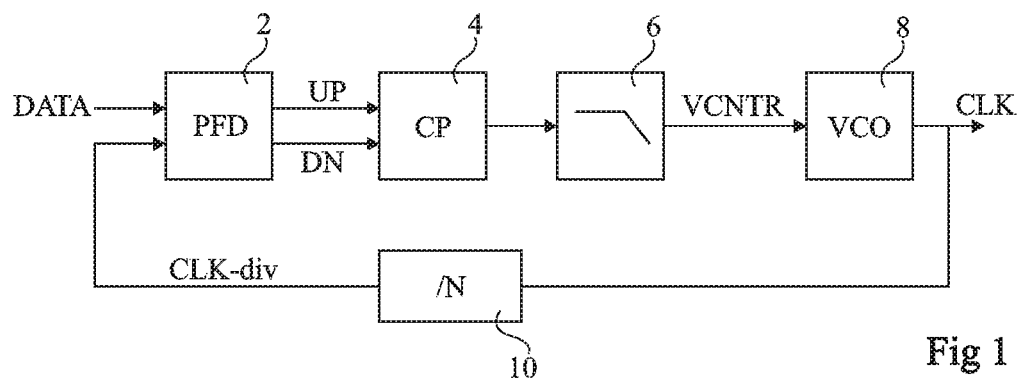
FIG. 1 is a block diagram of a phase-locked loop.

FIG. 1 schematically shows a phase-locked loop (PLL) example allowing the receiving system to synchronize a clock signal CLK, generated by a frequency-controlled oscillator which is part of the PLL, with a data signal DATA. An example of such a circuit is described on the Wikipedia website in the article "Phase-locked Loop."

The PLL includes a phase comparator 2 (PFD for "Phase Frequency Detector"). The comparator 2 receives the data signal DATA and a divided frequency clock signal CLK-div.

The phase comparator 2 provides two signals UP and DN that represent the phase difference between the data signal DATA and the clock signal CLK-div. For example, the comparator 2 detects a positive phase difference when the duration for which the signal UP takes the value 1 is longer than the duration for which the signal DN takes the value 1 and the comparator 2 detects a negative phase difference when the duration for which the signal DN takes the value 1 is longer than the duration for which the signal UP takes the value 1.

The signals UP and DN control a charge pump (CP) converter 4. The output voltage of the converter is a function of the signal UP and of the signal DN, i.e. of the phase difference between the data signal DATA and the clock signal CLK-div. More precisely, the output signal from the converter 4 is a voltage, the value of which increases when the signal UP is at 1 and decreases when the signal DN is at 1.

The output of the converter 4 is connected to a low-pass filter 6 making it possible to stabilize the system and to filter the noise present on the output signal from the converter 4. The output VCNTR of the low-pass filter 6 is applied to a command input for a voltage-controlled oscillator (VCO) 8.

The oscillator 8 provides a periodic signal forming a clock signal CLK, the frequency of which is a function of the input signal VCNTR thereof. The output of the oscillator is connected to the phase comparator 2 by a frequency divider 10 (/N). The frequency divider 10 divides the frequency of the clock signal CLK by an integer N greater than or equal to 1 in order to create the input clock signal CLK-div of the phase comparator 2.

If the signals UP and DN are identical, the system is synchronized, and the output voltage of the converter 4 and the frequency of the clock signal CLK do not vary.

The frequency CLK therefore converges towards a frequency corresponding to the frequency of the data signal.

Figure 2:
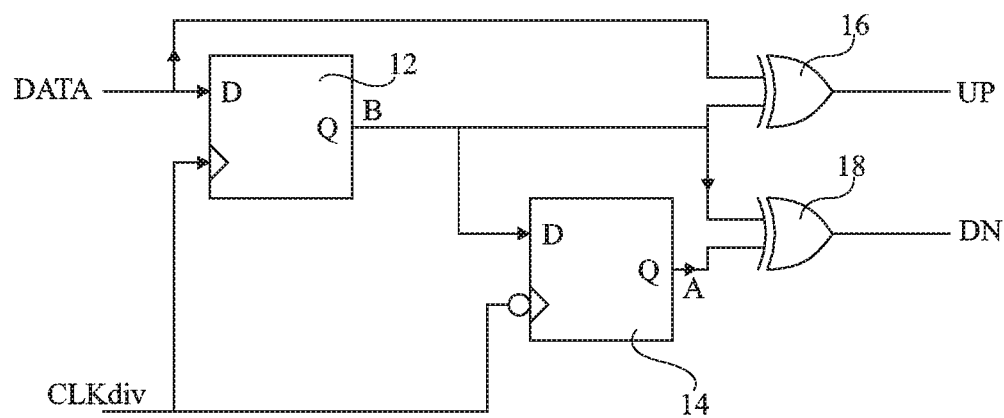
FIG. 2 schematically shows a Hogge detector.

FIG. 2 schematically shows a Hogge detector used as a phase comparator 2 (PFD). The detector includes two D flip-flops 12 and 14, each having a data input D, a clock input and an output Q taking the value of the input D at each rising edge of the clock signal. The flip-flop 12 receives the data signal DATA on the input D thereof and the signal CLK-div on the input thereof. The flip-flop 14 receives the output signal B from the flip-flop 12 on the input D thereof and the inverse signal of the signal CLK-div on the input thereof. Thus, the output Q of the flip-flop 14 takes the value of the input D at each falling edge of the clock signal CLK-div.

The detector also includes two Exclusive-OR gates 16 and 18. The inputs of the gate 16 are connected to the input D and to the output Q of the flip-flop 12, respectively. The output of the gate 16 forms the signal UP. The inputs of the gate 18 are connected to the output of the flip-flop 14 and to the output of the flip-flop 12, respectively. The output signal from the gate 18 forms the signal DN.

Figure 3:
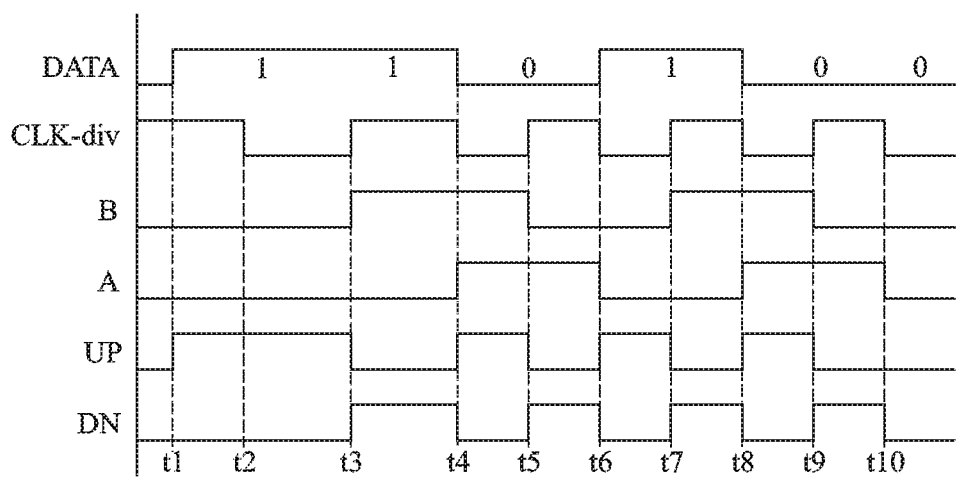
FIG. 3 is a timing diagram illustrating the operation of the detector of FIG. 2.

FIG. 3 is a timing diagram illustrating the operation of the Hogge detector described in connection with FIG. 2. The timing diagram shows: the data signal DATA, the clock signal CLK-div, the output signal B from the flip-flop 12, the output signal A from the flip-flop 14 and the output signals UP and DN from the phase comparator. The timing diagram shows ten notable times chronologically referenced as t1-t10.

If the data signal DATA corresponds to the values 1 1 0 1 0 0, the signal DATA takes the value 1 between the times t1 and t4 and between the times t6 and t8, and takes the value 0 outside these intervals.

By way of example, the case is considered where the frequency of the signal CLK-div is initially less than the frequency of the clock signal corresponding to the data signal DATA. The signal CLK-div has the value 0 between the times t2 and t3, between the times t4 and t5, between the times t6 and t7, between the times t8 and t9, and after t10. The signal CLK-div has the value 1 outside these intervals. The signal B is the output signal from the flip-flop 12. If the signal DATA has the value 0 at the moment of the rising edge of the signal CLK-div preceding the time t1, the signal B has the value 0 up to the time t3, which corresponds to the first rising edge of the signal CLK-div. At the time t3, the signal CLK-div has a rising edge and the signal DATA is at 1, and the signal B therefore takes the value 1. At the time t5, the signal CLK-div has a rising edge and the signal DATA is at 0, and the signal B therefore takes the value 0. For the same reasons, the signal B takes the value 1 at the time t7 and takes the value 0 at the time t9.

The signal A is the output signal from the flip-flop 14. If the signal B has the value 0 at the moment of the falling edge (not shown) of the signal CLK-div preceding the time t1, the signal A has the value 0 up to the time t4. At the time t4, the signal B has the value 1 and the signal CLK-div has a falling edge, and the signal A therefore takes the value 1. At the time t6, the signal CLK-div has a falling edge and the signal B is at 0, and the signal A therefore takes the value 0. For the same reasons, the signal A takes the value 1 at the time t8 and takes the value 0 at the time t10.

The signal UP corresponds to the output of the Exclusive-OR gate 16. The signal UP takes the value 1 when the signals DATA and B have opposite values. Thus, the signal UP is at the value 1 between the times t1 and t3, between the times t4 and t5, between the times t6 and t7, and between the times t8 and t9, and is at the value 0 outside these intervals.

The signal DN corresponds to the output of the Exclusive-OR gate 18. The signal DN takes the value 1 when the signals A and B have opposite values. Thus, the signal DN is at the value 1 between the times t3 and t4, between the times t5 and t6, between the times t7 and t8 and between the times t9 and t10, and is at the value 0 outside these intervals.

Each pulse of the signal UP is followed by a pulse of the signal DN. The voltage VCNTR controlling the VCO, and therefore the frequency of the clock signal CLK-div, increases or decreases depending on the ratio between the duration of the pulses of the signal UP and the duration of the pulses of the signal DN. Thus, in the case illustrated in FIG. 3, the pulse of the signal UP between the time t1 and the time t3 is longer than the pulse of the signal DN between the time t3 and the time t4, and the frequency is therefore more increased than decreased. The frequency of the clock signal CLK-div after the time t4 is therefore greater than that before the time t4. In the illustrated example, the frequency of the clock signal CLK-div after the time t4 is the sought frequency, and the pulses of the signals UP and DN therefore have the same length. Therefore, there are no variations in frequency once the sought frequency is achieved.

A disadvantage of this comparator is that the flip-flops are triggered solely by the clock signal CLK-div. Indeed, if the frequency of the signal CLK-div is close to the frequency of the data signal DATA, it is possible that all of the rising edges of the clock correspond to times during which the data signal has the same value. Such a situation can slow the synchronization of the clock signal.

Moreover, the Hogge detector makes it possible to obtain a clock signal having the same frequency as the clock signal corresponding to the transmitted data signal. However, the case described with reference to FIG. 3 shows that it is possible to converge towards a signal that is phase-shifted by π with respect to the clock signal corresponding to the transmitted data signal. Therefore, the result is obtained to within π, which does not make it possible to exactly determine the clock signal having generated the data signal.

Figure 4:
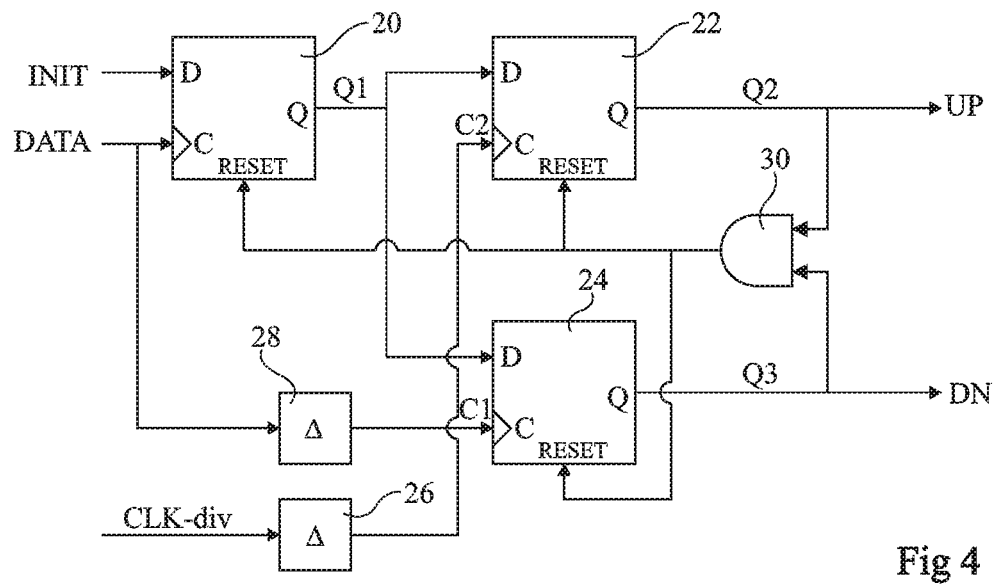
FIG. 4 schematically shows an embodiment of a phase comparator.

FIG. 4 schematically shows an embodiment of a phase comparator. The phase comparator of FIG. 4 corresponds, for example, to the phase comparator 2 included in a phase-locked loop such as that described with reference to FIG. 1.

The phase comparator has three inputs and two outputs. An input of the comparator is a set input receiving a signal INIT. The comparator 2 is active when the signal INIT has the value 1 and is inactive when the signal INIT has the value 0. Another input of the comparator is a data input receiving the data asynchronous signal DATA with which a clock signal is intended to be synchronized. Another input of the comparator is a clock input receiving the clock signal CLK-div, the frequency of which can be adjusted using the PLL. The two outputs provide the signals UP and DN controlling a converter 4.

The phase comparator comprises three flip-flops 20, 22 and 24, for example D flip-flops. Each flip-flop comprises a data input D, a clock input C, a reset input RESET and an output Q taking the value of the input signal at each edge (rising or falling) of the clock signal received by the input C.

The flip-flop 20 receives the set signal INIT on the input D thereof and the data signal DATA on the input C thereof. The output Q of the flip-flop 20 is connected to the inputs D of the other two flip-flops 22 and 24. The input C of the flip-flop 22 is connected to the output of a circuit 26 delaying the signal CLK-div by a delay Δ. For example, the delay Δ is known and defined by design. The delay Δ is, for example, between 2% and 50% of the data rate. The input C of the flip-flop 24 is connected to the output of a circuit 28 delaying the signal DATA by the same delay Δ. The output Q of the flip-flop 22 forms the output UP of the comparator and the output Q of the flip-flop 24 forms the output DN of the comparator. The outputs Q of the flip-flops 22 and 24 are connected to the inputs of an AND logic gate 30. The output of the AND gate is connected to the inputs RESET of the three flip-flops 20, 22 and 24.

Figure 5A:
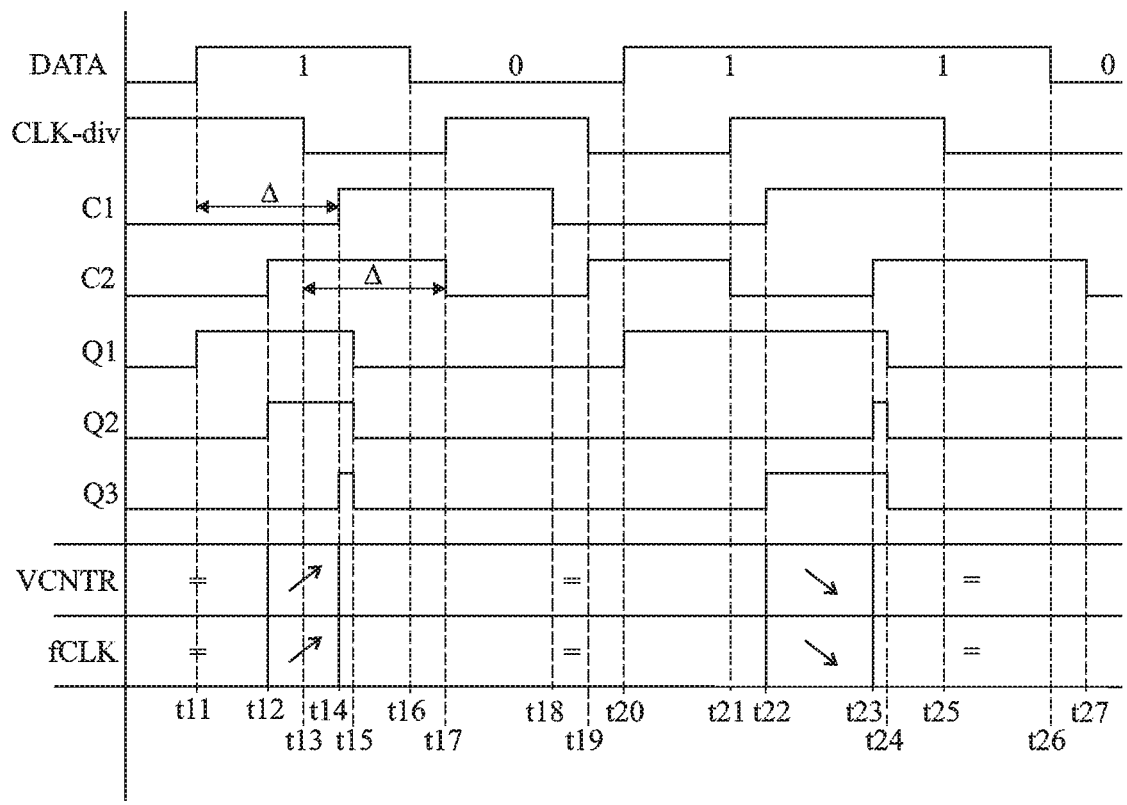
FIGS. 5A and 5B are timing diagrams showing the operation of a locked loop comprising the phase comparator of FIG. 4.
Figure 5B:
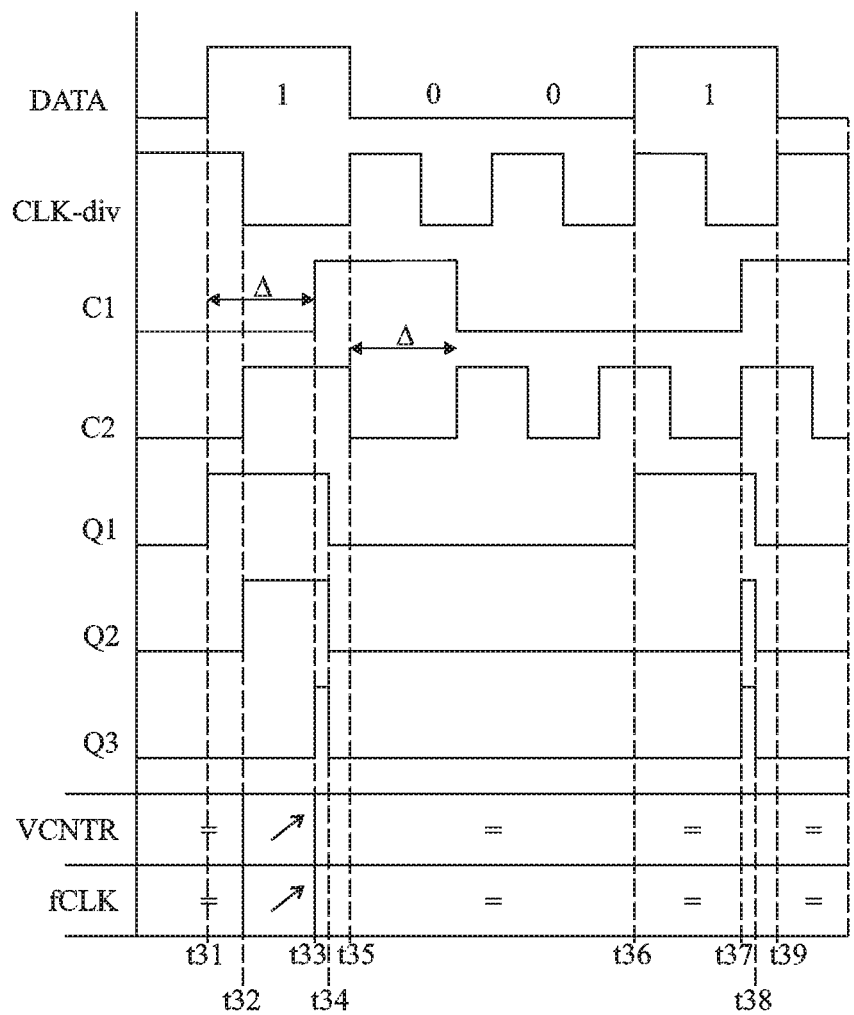

FIGS. 5A and 5B are timing diagrams describing the operation of the phase comparator of FIG. 4 in a PLL such as that described with reference to FIG. 1. More precisely, FIGS. 5A and 5B describe the progression of the data signal DATA, of the clock signal CLK-div, of signals C1 and C2 corresponding to the delayed data signal and to the delayed clock signal, respectively, of the signals Q1, Q2 and Q3 corresponding to the signals provided by the outputs Q of the flip-flops 20, 22 and 24, respectively, and the variations in the voltage VCNTR for controlling the VCO and in the frequency fCLK of the clock signal CLK.

The timing diagram of FIG. 5A has seventeen notable times chronologically referenced as t11-t27.

The data signal DATA takes the value 1 between the times t11 and t16 and between the times t20 and t26. The data signal DATA transmits the successive values 1 0 1 1 0.

The clock signal CLK-div has the value 1 up to the time t13, then between the times t17 and t19 and between the times t21 and t25.

The signals C1 and C2 are the signals DATA and CLK-div delayed by the same duration Δ. The signal C1 takes the value 1 between the times t14 and t18 and from the time t22. The signal C2 takes the value 1 between the times t12 and t17, between the times t19 and t21 and between the times t23 and t27.

The signal Q1 is the output signal from the flip-flop 20. When the comparator is active, the signal INIT keeps the value 1 constant. The signal Q1 therefore takes the value 1 at the first edge of the signal DATA and keeps this value until the input RESET of the flip-flop 20 receives a rising edge. The signal Q1 in this case takes the value 1 between the times t11 and t15 and between the times t20 and t24.

The signal Q2, which is the control signal UP for the converter 4, takes the value 1 at the first rising edge of the signal C2 following a rising edge of the signal DATA. The signal Q2 takes the value 0 when the input RESET of the flip-flop 22 receives a rising edge. Thus, the signal Q2 takes the value 1 between the times t12 and t15 and between the times t23 and t24.

The signal Q3, which is the control signal DN for the converter 4, takes the value 1 at the first rising edge of the signal C1 following a rising edge of the signal DATA. The signal Q3 takes the value 0 when the input RESET of the flip-flop 24 receives a rising edge. Thus, the signal Q3 takes the value 1 between the times t14 and t15 and between the times t22 and t24.

At the times t14 and t23, the signals Q2 and Q3 both have the value 1. The output signal from the gate 30, corresponding to the signal RESET of the flip-flops 20, 22 and 24, takes the value 1 and causes the flip-flops 20, 22 and 24 to reset. The duration between the times t14 and t15 and between the times t23 and t24 corresponds to the operating duration of the gate 30 and to the duration for resetting the flip-flops.

The voltage VCNTR for controlling the VCO and the frequency fCLK of the clock signal CLK-div are constant up to the time t12, between the times t14 and t22 and from the time t23.

Between the times t12 and t14, the signal Q2, i.e. the signal UP, is at 1 and the signal Q3, i.e. the signal DN, is at 0. The comparator detects a phase difference. The voltage VCNTR increases, along with the frequency fCLK of the clock signal CLK-div.

Between the times t22 and t23, the signal Q3, i.e. the signal DN, is at 1 and the signal Q2, i.e. the signal UP, is at 0. The voltage VCNTR decreases, along with the frequency fCLK.

The delay Δ is chosen such that it is possible for a rising edge of the signal C1 to be located between the rising edge of the signal Q1 signifying the detection of an edge of the data signal DATA and the rising edge of the signal C2.

The timing diagram of FIG. 5B presents notable times chronologically referenced as t31-t39.

The data signal DATA takes the value 1 between the times t31 and t35 and between the times t36 and t39 and takes the value 0 outside these intervals.

The clock signal CLK-div has the value 1 up until the time t32, has the value 0 between the times t32 and t35 and is the clock signal corresponding to the signal DATA after the time t35.

The signal Q1 takes a value 1 at the times t31 and t36 corresponding to the rising edges of the signal DATA, the signal Q2 takes the value 1 at the times t32 and t37 corresponding to the rising edges of the signal C2 which follow a rising edge of the signal DATA and the signal Q3 takes the value 1 at the times t33 and t37 corresponding to the rising edges of C1 which follow a rising edge of the signal DATA. At the times t33 and t37, the signals Q2 and Q3 have the value 1, which causes the flip-flops 20, 22 and 24 to reset and the signals Q1, Q2 and Q3 to return to 0 at the times t34 and t38.

Between the times t32 and t33, the signal Q2 has the value 1 and the signal Q3 has the value 0. The voltage VCNTR and the frequency fCLK of the signal CLK-div therefore increase. At the time t37, the clock signal and the data signal are already synchronized, and the signals C1 and C2 therefore have rising edges at the same time. The signals Q2 and Q3 take the value 1 at the same time which directly causes the flip-flops 20, 22 and 24 to reset. Thus, the frequency fCLK of the signal CLK-div has converged towards a frequency which does not vary.

An advantage of this embodiment is that the synchronization duration is short, for example approximately 200 ns.

An advantage of this embodiment is that there is no uncertainty regarding the synchronization.

Another advantage of this embodiment is that the comparator consumes little energy. Indeed, only one flip-flop is triggered by the edges of the clock signal, the others being triggered by the edges of the data signal and are only triggered when a useful edge occurs. In other words, some of the flip-flops are clocked only when a data stream is detected. For example, as shown in FIGS. 4 and 5, the flip-flop 20 is clocked when the signal DATA transitions from low to high (rising edge transition). Some embodiments may be implemented such that the flip-flop 20 is clocked when the signal DATA transitions from high to low (falling edge transitions).

Another advantage of this embodiment is that the circuit displays little sensitivity to low-frequency noise.

A specific embodiment has been described. Various alternatives and modifications will emerge to a person skilled in the art. In particular, the flip-flop 20 suitable for detecting the rising edges of the data signal can be replaced by another similar circuit.

The embodiment of FIGS. 4, 5A and 5B synchronizes the clock signal with the rising edges of the data signal. Nevertheless, the circuit can be easily adapted to synchronize the clock signal with the falling edges of the data signal or with the rising and falling edges of the data signal.

What is claimed is:

1. A clock synchronizing circuit comprising:
   a phase comparator comprising a first circuit having a first input configured to receive a data signal, the first circuit configured to detect edges of the data signal;
   a second circuit comprising a clock generator configured to generate a clock signal with adjustable frequency, wherein the phase comparator is configured to compare, after detecting an edge of the data signal, an edge of the data signal with an edge of the clock signal, and wherein the second circuit is configured to modify a frequency of the clock signal as a function of an output signal of the phase comparator;
   a first delay circuit having an input coupled to an output of the clock generator; and
   a second delay circuit having an input coupled to the first input of the first circuit, wherein the phase comparator comprises a second flip-flop having a data input and a clock input and a third flip-flop having a data input and a clock input, wherein the data input of each of the second and third flip-flops are coupled to an output of the first circuit, wherein the clock input of the second flip-flop is coupled to an output of the first delay circuit, wherein the clock input of the third flip-flop is coupled to an output of the second delay circuit, and wherein the outputs of the second and third flip-flops are coupled to the second circuit.

2. The circuit of claim 1, wherein the edges of the data signal comprise falling edges.

3. The circuit of claim 1, wherein the first circuit comprises a first flip-flop having a data input coupled to a high-voltage rail and a clock input coupled to a data signal line.

4. The circuit of claim 1, wherein the phase comparator comprises an AND gate having inputs coupled to the outputs of the second and third flip-flops and an output coupled to reset inputs of the second and third flip-flops, the output of the AND gate being further coupled to the first circuit.

5. The circuit of claim 1, wherein the first delay circuit is configured to receive at the input of the first delay circuit the clock signal and to generate at the output of the first delay circuit a delayed clock signal that is delayed by a first duration, and wherein the second delay circuit is configured to receive at the input of the second delay circuit the data signal and to generate at the output of the second delay circuit a delayed data signal that is delayed by a second duration, wherein the first duration comprises a duration between 2% and 50% of a data rate of the data signal and wherein the second duration comprises a duration between 2% and 50% of the data rate of the data signal.

6. The circuit of claim 5, wherein the first duration is equal to the second duration.

7. The circuit of claim 1, wherein the first circuit is configured to detect rising edges of the data signal.

8. The circuit of claim 1, wherein the clock generator comprises a voltage controlled oscillator.

9. The circuit of claim 1, wherein the second circuit comprises a charge pump having an output coupled to the clock generator.

10. The circuit of claim 9, wherein the second circuit further comprises a low-pass filter coupled between the charge pump and the clock generator.

11. The circuit of claim 1, wherein the second circuit comprises a clock divider coupled between an output of the clock generator and an input of the phase comparator.

12. A method of recovering a clock signal associated with a data signal, the method comprising:
   generating the clock signal;
   receiving the data signal at a clock input of a first flip-flop;
   detecting a first edge of the data signal;
   after detecting the first edge of the data signal, comparing an edge of the data signal with an edge of the clock signal;
   generating an up signal and a down signal based on the comparison by:
     receiving an output of the first flip-flop with a data input of a second flip-flop;
     receiving the output of the first flip-flop with a data input of a third flip-flop;
     receiving a delayed version of the data signal at a clock input of the third flip-flop;
     receiving a delayed version of the clock signal at a clock input of the second flip-flop;
     generating the up signal with an output of the first flip-flop; and
     generating the down signal with an output of the second flip-flop;
   adjusting a voltage of a charge pump circuit based on the up and down signals; and
   modifying a frequency of the clock signal based on the voltage of the charge pump circuit.

13. The method of claim 12, further comprising generating the data signal and transmitting the data signal.

14. The method of claim 12, further comprising receiving an enable signal at a data input of the first flip-flop.

15. The method of claim 12, wherein modifying the frequency of the clock signal comprises:
   when the up signal is higher than the down signal, increasing the frequency of the clock signal; and
   when the down signal is higher than the up signal, decreasing the frequency of the clock signal.

16. The method of claim 12, further comprising:
   resetting the first, second, and third flip-flops when the up signal is high and the down signal is high.

17. The method of claim 12, wherein a rising edge of the delayed version of the data signal is located between a rising edge of an output of the first flip-flop and a rising edge of the delayed version of the clock signal.

18. The method of claim 12, wherein generating the clock signal comprises:
   generating a first clock signal with a clock generator; and generating the clock signal by dividing the first clock signal by N, wherein N is an integer greater or equal to 1.

19. A circuit comprising:
a clock generator configured to generate a clock signal; and
a phase detector having an output coupled to the clock generator, the phase detector comprising:
a first flip-flop having a clock input configured to receive an asynchronous data signal,
a second flip-flop having a data input coupled to an output of the first flip-flop, and a clock input,
a third flip-flop having a data input coupled to the output of the first flip-flop, and a clock input,
a first delay circuit having an input coupled to an output of the clock generator and an output coupled to the clock input of the second flip-flop,
a second delay circuit having an input coupled to the clock input of the first flip-flop and an output coupled to the clock input of the third flip-flop, wherein the phase detector is configured to:
  detect a first edge of the asynchronous data signal,
  after detecting the first edge of the asynchronous data signal, compare an edge of the asynchronous data signal with an edge of the clock signal, and
  modify a frequency of the clock signal based on the comparison.

20. The circuit of claim 19, wherein the phase detector further comprises an AND gate having inputs coupled to the outputs of the second and third flip-flops and an output coupled to reset inputs of the first, second and third flip-flops.

21. The circuit of claim 19, wherein the first delay circuit is configured to receive at the input of the first delay circuit the clock signal and to generate at the output of the first delay circuit a delayed clock signal that is delayed by a first duration, and wherein the second delay circuit is configured to receive at the input of the second delay circuit the asynchronous data signal and to generate at the output of the second delay circuit a delayed asynchronous data signal that is delayed by a second duration, wherein the first duration comprises a duration between 2% and 50% of a data rate of the asynchronous data signal and wherein the second duration comprises a duration between 2% and 50% of the data rate of the asynchronous data signal.

22. The circuit of claim 21, wherein the first duration is equal to the second duration.

* * * * *